United States Patent
Tanda

(10) Patent No.: US 7,851,999 B2
(45) Date of Patent: Dec. 14, 2010

(54) LIGHT EMITTING DEVICE

(75) Inventor: Yuichiro Tanda, Shinjuku-ku (JP)

(73) Assignee: Nichia Corporation, Anan-shi (JP)

( * ) Notice: Subject to any disclaimer, the term of this patent is extended or adjusted under 35 U.S.C. 154(b) by 88 days.

(21) Appl. No.: 12/404,346

(22) Filed: Mar. 16, 2009

(65) Prior Publication Data

US 2009/0180285 A1 Jul. 16, 2009

Related U.S. Application Data

(63) Continuation of application No. 11/615,593, filed on Dec. 22, 2006, now Pat. No. 7,521,863.

(30) Foreign Application Priority Data

Jan. 13, 2006 (JP) .............................. 2006-006489
Mar. 22, 2006 (JP) .............................. 2006-079147

(51) Int. Cl.
*H01J 1/62* (2006.01)
*H01L 33/00* (2010.01)
*F21V 29/00* (2006.01)

(52) U.S. Cl. .................... 313/512; 362/800; 257/10

(58) Field of Classification Search ................. 313/512; 257/10, 98; 362/267, 800; 361/717
See application file for complete search history.

(56) References Cited

FOREIGN PATENT DOCUMENTS

JP 3469890 B2 12/2002
JP 2006-32804 A 2/2006

*Primary Examiner*—Joseph L Williams
(74) *Attorney, Agent, or Firm*—Ditthavong Mori & Steiner, P.C.

(57) ABSTRACT

A light emitting device includes an insulating board, a metal member, a light emitting element, a conductive member, and a transparent member. The insulating board defines a through hole. The metal member is inserted into the through hole. The light emitting element is mounted on the top surface of the metal member. The conductive member is formed on the insulating board and is electrically connected to the light emitting element. The transparent member covers the light emitting element and the top surface of the insulating board. The metal member has a substantially stepped rectangle in a cross-sectional view. The top surface of the substantially stepped rectangle of the metal member projects higher than the top surface of the insulating board. The insulating board is mated with the metal member.

12 Claims, 6 Drawing Sheets

LIGHT EMITTING DEVICE

BACKGROUND OF THE INVENTION

1. Field of the Invention

The present invention relates to a light emitting device.

2. Description of the Related Art

Light emitting elements such as light emitting diode (hereinafter, occasionally referred to as an "LED") and semiconductor laser (hereinafter, occasionally referred to as an "LD") have been used as various types of light sources. Particularly, light emitting diodes capable of emitting light at high luminance higher than 1000 mcd have been developed, and are increasingly applied to lighting for mobile phone LCD backlight, character display board used outdoors or indoors such as large-scale full-color display. In the case to display complex characters such as JIS 2nd level Kanji, a very high resolution display is required.

On the other hand, the aforementioned light emitting elements generate heat when emitting light. Accordingly, in the case of high resolution display, if light emitting devices with the aforementioned light emitting elements mounted thereto are simply installed on a circuit board at high density, the heat generated by the light emitting elements causes property deterioration of members in the light emitting device or a malfunction.

As a light emitting device that has excellent heat dissipation properties and is suitable for high density installation, a light emitting device that has an insulating board with a hole for heat sink, a sub-insulating sheet laminated on the board for enclosing the hole, and a light emitting element mounted on the sub-insulating sheet above the hole is disclosed (Japanese Patent Publication No. 3469890). In addition, as a technique for improving heat dissipation properties, the publication discloses that another hole smaller than the light emitting element is formed on the sub-insulating sheet below the light emitting element so that the light emitting element is in direct contact with air, and that a conductive member is applied on or filled in the hole.

However, since the light emitting device proposed in the aforementioned patent publication has the structure where the light emitting device itself dissipates heat generated by the light emitting element, its heat dissipation performance is limited. Thus, further improvement is required.

Therefore, it is an object of the present invention is to provide a light emitting device that has excellent reliability and light-outgoing efficiency.

SUMMARY OF THE INVENTION

According to one aspect of the present invention, a light emitting device includes an insulating board, a metal member, a light emitting element, a conductive member, and a transparent member. The insulating board defines a through hole. The metal member is inserted into the through hole. The light emitting element is mounted on the top surface of the metal member. The conductive member is formed on the insulating board and is electrically connected to the light emitting element. The transparent member covers the light emitting element and the top surface of the insulating board. The metal member has a substantially stepped rectangle in a cross-sectional view. The top surface of the substantially stepped rectangle of the metal member projects higher than the top surface of the insulating board. The insulating board is mated with the metal member.

The above and further objects of the present invention as well as the features thereof will become more apparent from the following detailed description to be made in conjunction with the accompanying drawings.

DETAILED DESCRIPTION OF THE PREFERRED EMBODIMENT

First Embodiment

Figure 1:
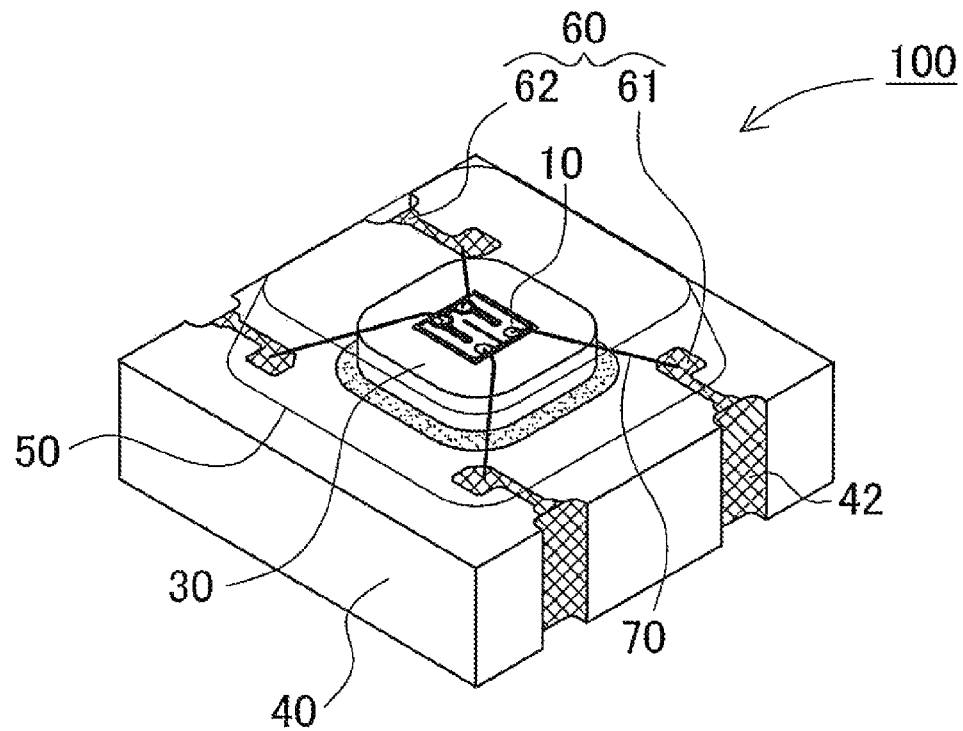
FIG. 1 is a perspective view schematically showing a light emitting device according to an embodiment of the present invention as viewed from the top surface side.
Figure 2:
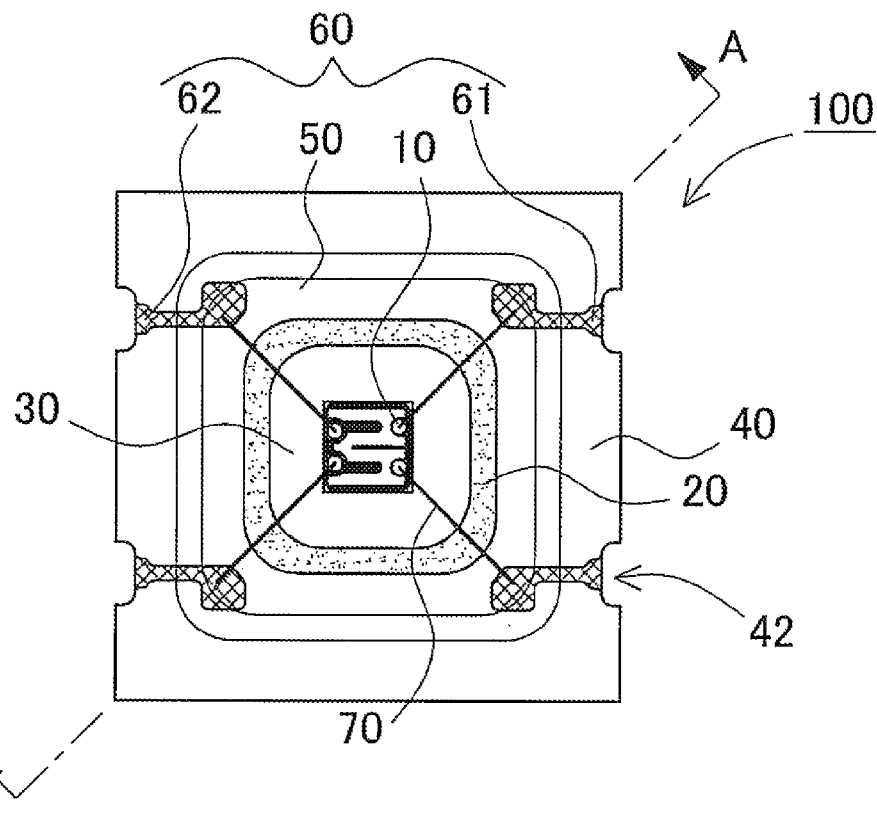
FIG. 2 is a plan view schematically showing the light emitting device shown in FIG. 1.
Figure 3:
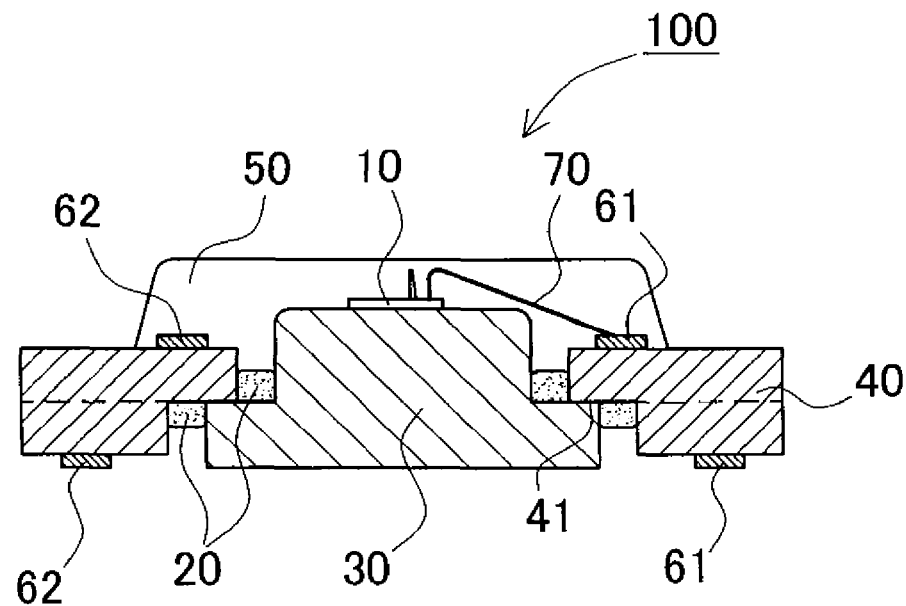
FIG. 3 is a cross-sectional view schematically showing the light emitting device shown in FIG. 1.
Figure 4:
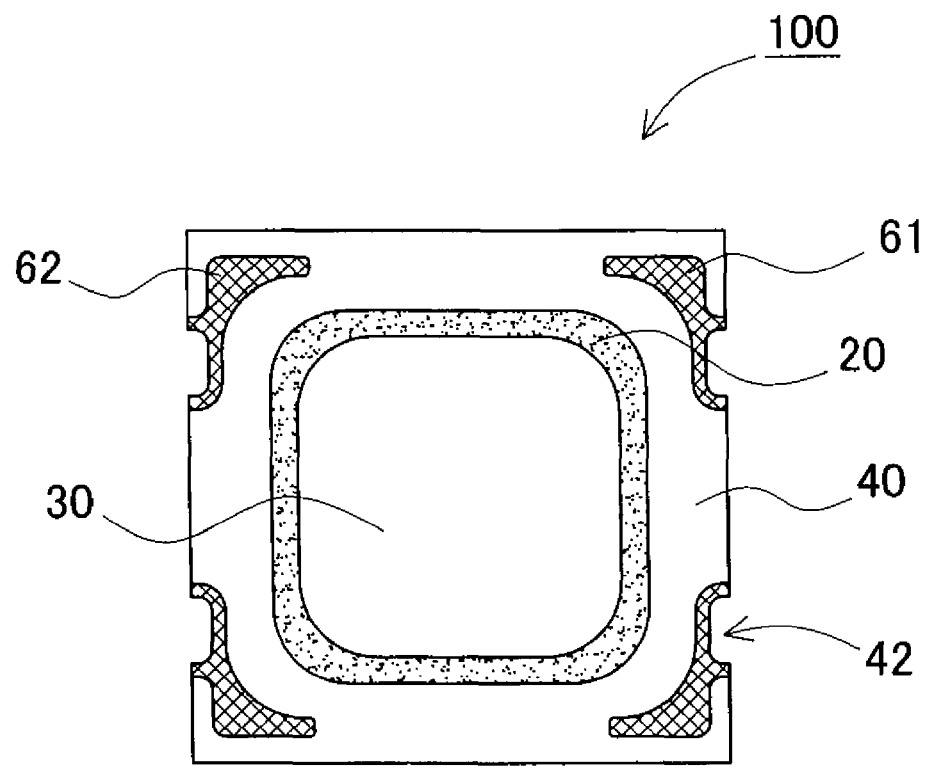
FIG. 4 is a bottom view schematically showing the light emitting device shown in FIG. 1.

A light emitting device according to a first embodiment has the following structure. FIGS. 1 through 4 are views schematically showing the light emitting device according to the first embodiment. FIG. 1 is a perspective view schematically showing the light emitting device according to this embodiment as viewed from the top surface side. FIG. 2 is a plan view schematically showing the light emitting device according to this embodiment. FIG. 3 is a cross-sectional view schematically showing the light emitting device according to this embodiment taken along the line A-A in the schematic view of FIG. 2. FIG. 4 is a bottom view schematically showing the light emitting device according to this first embodiment. The following description will describe the light emitting device with reference to drawings.

A light emitting device 100 according to the first embodiment comprises a light emitting element 10, a metal member 30, an insulating board 40, and a transparent member 50. The light emitting element 10 is secured on the top surface of the metal member 30 with a die-bonding member. The metal member 30 is inserted into the insulating board 40 so that the light emitting element 10 is disposed on the top surface side. The transparent member 50 seals the light emitting element 10 and can pass light from the light emitting element 10. The insulating board 40 has a substantially rectangular shape, and is provided with a through hole and through grooves 42. The through hole is located in substantially the middle of the insulating board 40, and can accommodate the metal member 30. The through grooves 42 are located on a pair of side surfaces opposed to each other. In addition, conductive members 60 are formed in a pattern on the surface of the insulating board 40, and are electrically connected to the light emitting element 10. Specifically, the bottom surfaces of the conductive members 60 are substantially coplanar with the bottom surface of the metal member 30 on the bottom surface side of the insulating board 40. The components according to this embodiment will be described.

Insulating Board 40

In the light emitting device 100 according to this embodiment, the insulating board 40 is a thin rectangular parallelepiped that has a substantially square shape in the plan view. The through hole is formed in the middle in a thickness direction. The through hole has a substantially square shape with rounded corners in the plan view. In addition, the through hole has a substantially stepped rectangle in the cross-sectional view taken along a line perpendicular to the plane of the insulating board 40. Additionally, on the pair of side surfaces of the insulating board 40 opposed to each other, the grooves 42 are formed in a substantially rectangular shape with rounded inside corners in the plan view. The metal member 30 is inserted into the through hole of the insulating board 40 so as to enclose the through hole. The light emitting element 10 is mounted on the top surface of the metal member 30. In addition, a plurality of the conductive members 60 are formed on the top surface of the insulating board 40 so as to surround the through hole. The conductive members 60 that are formed on the top surface beside the pair of side surfaces of the insulating board 40 opposed to each other are continuously formed to the bottom surface of the insulating board via the grooves 42 of the insulating board 40. Note that, in the present invention, the shapes of the insulating member 40, the through hole and the groove 42 can be varied for different purposes. The numbers of them can be also varied.

A resin board, a hybrid board such as glass epoxy board of an organic material containing an inorganic material, and an inorganic board such as ceramic board can be used as a material of the insulating board 40. Particularly, if high heat resistance or high weather resistance is required, a hybrid board or an inorganic board is preferably used. According to the embodiment of the present invention, a plurality of sets of other members are subjected to processes and assembled into the insulating board 40 to form a cluster of light emitting elements, then the insulating board 40 is separated into an individual light emitting device. Therefore, it is possible to provide a plurality of light emitting devices at low cost. In addition, in the case where a light emitting device with high contrast is required, $Cr_2O_3$, $MnO_2$, $TiO_2$, $Fe_2O_3$ or the like is preferably contained in a base material of the insulating board to provide a dark insulating board.

Alumina, aluminum nitride, mullite and so on are preferable as a main material of ceramic board. These types of main material are added with a sintering agent, and then sintered to obtain a ceramic board. Ceramic obtained by sintering 90-96% by weight of alumina as raw material powder with 4-10% by weight of talc, magnesia, calcia, silica or the like added thereto as a sintering agent at temperature range between 1500 and 1700° C., ceramic obtained by sintering 40-60% by weight of alumina as raw material powder with 60-40% by weight of borosilicate glass, cordierite, forsterite, mulite or the like added thereto as a sintering agent at temperature range between 800 and 1200° C., and so on can be given as examples.

This type of ceramic board can have various shapes in a green sheet stage before burning. First, a green sheet as a base material before burning is subjected to processing so as to provide the through hole and the grooves 42 in desired shapes. Green sheets are laminated if required. Subsequently, the conductive members 60 are formed in a pattern in desired locations by using a paste material of resin binder containing a high melting-point metal such as tungsten and molybdenum in a screen printing manner, or the like. Sintering the thus-processed base material can provide the insulating board 40 with the through hole, the grooves 42 and the conductive members 60 formed therein.

Through Hole

In the light emitting device 100 according to this embodiment, the through hole with a stair-shaped inner wall is formed. This through hole can be formed by laminating insulating board sheets having holes with different size as viewed from the light emission side of the insulating board. In the light emitting device 100 according to this embodiment, the metal member 30 is positioned at and bonded to a middle surface 41 of the through hole. In this case, while an upper insulating board sheet of the insulating board sheets to be laminated is formed so that its opening width becomes wider as closer to the top side, a lower insulating board sheet is formed so that its opening width becomes wider as closer to the bottom side. This arrangement can ensure that the middle surface 41 serves as a positioning and bonding surface for the metal member 30, and additionally can increase the distance between the conductive member 60 formed on the top and bottom surfaces of the insulating board and the side surface of the metal member 30. Therefore, it is possible to produce a smaller light emitting device at high yield. In this arrangement, the through hole with its opening width becomes wider in a certain direction can be formed by cutting with a cutting tool having a blade with a volumetric width that becomes wider in a certain direction in a shape similar to the through hole. Alternatively, it can be formed by varying a contact angle of a cutting tool used in formation of an ordinary through hole relative to the insulating board sheet surface. In addition, a plurality of insulating board sheets with through holes formed therein may be laminated so that the inner wall of the insulating board is formed in stairs. In this case, the inner wall formed in stairs can be smooth surface by pressing a forming die against the inner wall formed in stairs, thus, the insulating board can have a through hole with its bore that becomes wider in a certain direction.

Groove 42

In the light emitting device 100 according to this embodiment, two of grooves 42 are formed in a substantially rectangular shape with rounded inside corners in the plan view and extend from the top surface to the bottom surface on each side of the pair of side surfaces of the insulating board 40 opposed to each other. Cathode and anode terminals 61 and 62 among the conductive members 60 that are formed on the top surface of the insulating board 40 are formed and extend in the inner walls of the grooves 42 on the pair of side surfaces of the insulating board 40 opposed to each other. The thus-constructed light emitting device can be electrically externally conducted via the inner walls of the grooves 42. Therefore, it is possible to improve installation of the light emitting device. The light emitting device 100 according to this embodiment, the grooves 42 extend from the top surface to the bottom surface of the insulating board 40, however, it is not necessary to extend them to reach the top surface. They may extend on only lower surface side of the insulating board 40.

Conductive Member 60

In the light emitting device according to the embodiment of the present invention, the conductive members 60 that are formed at least on the sides of a pair of the side surfaces of the insulating board are the cathode and anode terminals 61 and 62, and extend from the top surface to the bottom surface of the insulating board. The wiring pattern of the conductive member 60 can be suitably varied depending on the number of the light emitting elements 10, and type and size of the light emitting element 10. The material of the conductive member 60 is not specifically limited if having conductivity, but preferably has high conductivity. As this type of material, tungsten, chromium, titan, cobalt, molybdenum, alloy of them, and so on can be given. In addition, the outermost surface of the conductive member 60 is covered preferably with a member that has high reflectivity for light from the light emitting element 10 to be mounted. It is preferable that the transparent member 50 covers a majority part of the conductive member 60 formed on the top surface of the insulating board 40. In this case, it is possible to suppress deterioration of the light emitting device. Additionally, it is preferable that an antioxidation film is formed on a part of the conductive member that is exposed outward. Furthermore, it is preferable that a cathode mark is provided on one of the conductive members 60 formed on the top surface on the sides of the pair of the side surfaces of the insulating board.

In the light emitting device 100 according to this embodiment, the cathode and anode terminals 61 and 62 that are formed continuously from the top surface of the insulating board 40 to the grooves 42 are formed so as to extend to the bottom surface of the insulating board 40. The cathode and anode terminals 61 and 62 that are formed on the bottom surface of the insulating board 40 are formed from the grooves 42 that are formed on the side surface of the insulating board 40 toward the corner sides of the insulating board 40. This can prevent short circuit caused by movement of solder toward the metal member 30 when the light emitting device 100 is installed onto a wiring board by soldering. Therefore, it is possible to highly reliably install the light emitting device 100. In addition, although two cathode terminals 61 and two anode terminals 62 are provided in the light emitting device 100 according to this embodiment, corresponding to the circuitry shape of a wiring board, the cathode terminals 61 may be connected to each other as one terminal, and the anode terminals 62 may be connected to each other as one terminal on the bottom side surface side of the insulating board.

Metal Member 30

In the light emitting device according to the embodiment of the present invention, the metal member 30 is inserted into and secured in the through hole provided in the insulating board 40. The light emitting element is mounted on the top surface of the metal member 30. Specifically, in the light emitting device according to the embodiment of the present invention, on the bottom surface side of the insulating board 40, the bottom surface of the metal member 30 is substantially coplanar with the bottom surfaces of the conductive members 60 that are formed on the bottom surface of the insulating board. Accordingly, heat stored in the light emitting device is not dissipated into air from the surface of the light emitting device, but is efficiently dissipated to a wiring board on which the light emitting device is installed. Therefore, it is possible to suppress a temperature rise of the light emitting device.

Hereinafter, the description will be directed to a wiring board on which the light emitting device is installed. In the wiring board on which a SMD type of light emitting device capable of electrically connected via its surface as in the light emitting device according to the embodiment of the present invention is installed, a circuitry portion made of copper foil and so on is wired on a base material, and an insulating film is laminated on the outermost surface. A circuitry wire is exposed in a desired shape by etching on the insulating film side as the outermost surface. That is, the circuitry portion of the wiring board is disposed in a part recessed from the outermost surface. Accordingly, in the case where the wiring board is simply provided with a conventional light emitting device that has an insulating board and a metal member that have bottom surfaces coplanar with each other, and a conductive members for external connection that have bottom surfaces located below them, the bottom surface of the metal member cannot be in direct contact with the circuitry portion of the wiring board. As a result, heat that is conducted to the metal member 30 cannot be dissipated to the wiring board side, if the metal member 30 is not secured with other certain member. If the metal member 30 is secured with other certain member, heat dissipation efficiency decreases. On the other hand, in the case where the surface of the metal member 30 is exposed to air, although the light emitting device dissipates heat to some extent, such dissipation is limited. For this reason, this type of light emitting device is not suitable for application of a large amount of current. Thus, in the embodiment of the present invention, the bottom surface of the metal member 30 is arranged so as to be coplanar with the bottom surface of the conductive member 60 as external connection surface 60. Therefore, it is possible to provide a light emitting device that can efficiently externally dissipate heat stored in the light emitting device to the wiring board.

Although a wiring board on which the light emitting device according to the embodiment of the present invention is installed is not specifically limited, a wiring board that includes metal such as copper and aluminum as a base material, and a metal-core wiring board that has the aforementioned metal inserted into a middle layer are preferably used. In this case, it is possible to further suppress a temperature rise of the light emitting device. In addition, in the case where the light emitting device according to the embodiment of the present invention is used together with a wiring member that employs a low elastic insulating layer as an insulating layer of the wiring board, it is possible to suppress solder cracks between the light emitting device and the circuitry portion. Therefore, it is possible to provide equipment suitable for vehicle and so on. Additionally, in the case where a single-sided metal base wiring board is used, a metal base is secured to a member with excellent heat dissipation properties such as aluminum block, thus, heat dissipation of the light emitting device can be further improved.

It is preferable that the top surface of the metal member 30 projects higher than the top surface of the insulating board 40. In this case, light from the light emitting element 10 efficiently can outgo. However, in the case where the top surface of the metal member 30 projects higher than the top surface of the insulating board 40, and the light emitting element 10 is mounted on the top surface of the metal member 30 and is sealed by the transparent member 50, the light emitting element 10 tends to be intensively subjected to stress on the transparent member 50 due to heat during manufacturing or light emission. Thus, a bonding part between the light emitting element and other member may be damaged. For this reason, it is preferable that the top surface of the metal member 30 and the exterior surface of the transparent member 50 form an angle not more than 90 degrees. This arrangement can suppress that the light emitting element 10 that is located higher than the periphery is intensively subjected to stress due to heat. In addition, it is preferable that the half-value angle of light from the thus-constructed transparent member 40 is greater than 90 degrees. In this case, uniform light can be widely obtained, and light outgoing efficiency can be high. Therefore, it is possible to suppress a temperature rise of the light emitting device.

It is preferable that the side surface of the metal member 30 is partially bonded to the through hole of the insulating board 40. In this case, it is possible to suppress loss of unity among the members caused by stress due to heat. The shape of the metal member 30 is not specifically limited if the metal member 30 has thickness and size that can sufficiently provide heat dissipation effect suitable for on power consumption of the light emitting element 10 to be mounted, or the like. However, it is preferable that the metal member 30 has the area of the bottom surface larger than the top surface. In this case, heat conducted from the light emitting element on the top surface side can be efficiently conducted to the bottom surface. Particularly, in the case where the metal member 30 has a substantially stepped rectangle in a cross-sectional view taken along a line perpendicular to its top surface, the through hole has an inner wall that is also formed in a substantially stepped rectangle. In this case, it is preferable that a second upper surface of the metal member 30 is bonded on a flat surface inside the through hole. This can provide a light emitting device that has high precision and is highly reliable. A material employed as the metal member 30 in the embodiment of the present invention is not specifically limited if it is a metal material that includes excellent thermal conductivity metal as principal material. Copper, aluminum, magnesium and so on can be suitably used.

Adhesive Member 20

Although the material 20 used for bonding the metal member 30 and the inner wall of the through hole of the insulating board 40 is not specifically limited if it can secure them. However, in the case where the adhesive member 20 that contains a principal component of the metal member is used, it is possible to improve securing strength. Particularly, in the case where a ceramic board is used, since it has excellent heat resistance, the metal member 30 can be secured by hard soldering or eutectic junction that can provide bonding at high strength. For example, silver solder that contains an alloy of silver and copper as a principal component, brass solder that contains an alloy of copper and zinc as a principal component, aluminum solder that contains aluminum as a principal component, nickel solder and so on can be used. In particular, it is preferable that the metal member 30 and the inner wall of the through hole of the insulating board 40 are partially bonded with an adhesive member that contains a principal component of the metal member 30. In this case, it is possible to relieve residual stress due to thermal expansion coefficient difference between the metal member 30 and the insulating board 40.

Metal Film

Furthermore, it is preferable that the light emitting device has a metal film extending on the surfaces from the metal member 30 to the adhesive member 20. In this case, it is possible to further improve reliability. Particularly, it is preferable that the metal film formed on the light emission side has a layer composed of a high reflective metal such as chromium and silver at least as the outermost layer. In this case, it is possible to obtain an effect that improves outgoing efficiency of light emitted from a lower part of the light emitting element. In addition, in the case where the surface of the metal film is polished to a mirror-smooth state by silver or white surface treatment, it is possible to obtain a similar effect. Additionally, it is preferable that the metal film formed on the installation side has a layer composed of oxidation resistance metal such as gold and stainless steel alloy at least as the outermost layer.

Light Emitting Element 10

A semiconductor, such as GaAlN, ZnS, ZnSe, SiC, GaP, GaAlAs, AlN, InN, AlInGaP, InGaN, GaN, and AlInGaN, which is formed on a substrate is employed as the light emitting element 10. Homo structure, hetero structure, or double-hetero structure with MIS junction, PIN junction or PN junction can be used as the structure of the semiconductor layer. The materials and the crystal mixture ratio of semiconductor can be variously selected to obtain wavelengths from the ultraviolet to infrared light. The light emitting layer can have a single quantum well structure or a multi-quantum-well structure with thin layer(s) for providing a quantum effect.

In consideration of outdoors use, it is preferable that a gallium-nitride group compound semiconductor is employed as a semiconductor material that can form a high luminance light emitting element. On the other hand, in the case of red light emission, gallium aluminum arsenide group semiconductor, or an aluminum indium gallium phosphide group semiconductor is preferably used. However, various types of semiconductor can be used depending on application of the light emitting device.

In the case where a gallium-nitride group compound semiconductor is used, a material, such as sapphire, spinel, SiC, Si, ZnO, and a GaN single crystal, is used as the substrate for semiconductor. In order to manufacture a gallium nitride with good crystallinity in quantity, it is preferable to employ a sapphire substrate. An example of the light emitting element 10 that employs a nitride compound group semiconductor is shown. A buffer layer, such as GaN and AlN, is formed on the sapphire substrate. A first contact layer of n- or p-type GaN, an active layer of thin InGaN layer for providing a quantum effect, a cladding layer of p- or n-type AlGaN, and a second contact layer of p- or n-type GaN are successively formed thereon. A gallium-nitride group compound semiconductor has n-type conductivity in the state where an impurity is not doped. In addition, in order to improve luminous efficiency, or to achieve other purpose, when a desired n-type gallium-nitride semiconductor is formed, it is preferable that Si, Ge, Se, Te, C, or the like, is doped, if necessary.

On the other hand, when a p-type gallium-nitride semiconductor is formed, Zn, Mg, Be, Ca, Sr, Ba, or the like, which are p-type dopants, are doped. Even if a gallium-nitride group compound semiconductor is doped with a p-type dopant, this can hardly provide p-type conductivity. Accordingly, after a p-type dopant is doped, it is necessary to anneal the semiconductor by heating with a furnace, low electron beam irradiation, plasma irradiation, and so on. After a thus-constructed semiconductor wafer formed is partially etched, positive and negative electrodes are formed thereon. Then, the semiconductor wafer is cut in a desired size, thus, the light emitting element can be formed.

A plurality of the thus-constructed light emitting element 10 can be suitably used as desired. Various types of light emitting devices can be constructed depending on combination of colors of the elements, and arrangement. For example, light emitting devices can be selectively arranged in various types of arrangement such as dot matrix and linear shape. In this case, it is possible to provide light emitting equipment that has very high installation density and excellent heat dissipation. In addition, in the case of application for a full-color light emitting device for display equipment, the light emitting device preferably includes a red range light emitting element with light emission wavelength between 610 and 700 nm, a green range light emitting element with light emission wavelength between 495 and 565 nm, and a blue range light emitting element with light emission wavelength between 430 and 490 nm, which are used in combination. Additionally, in the light emitting device according to the embodiment of the present invention, in the case where white range color mixture light is emitted by using a phosphor material, in terms of complementary color relationship with light-emission wavelength from the material, deterioration of a transparent resin, and so on, the light emission wavelength of the light emitting element 10 is preferably not less than 400 nm and not more than 530 nm, more preferably not less than 420 nm and not more than 490 nm. In order to further improve excitation and light emission efficiency between the light emitting element and the phosphor material, the light emission wavelength is most preferably not less than 450 nm and not more than 475 nm. Note that, in the case of combination with a member that is relatively less prone to deteriorate due to ultraviolet rays, a light emitting element with the main light-emission wavelength less than 400 nm in the ultraviolet range or a short wavelength range in visible light can also be used as the light emitting element 10.

In addition, the light emitting element 10 can be secured on the top surface of the metal member 30 so as to interpose an ancillary member such as a support body with a conductive member wired on its surface or a so-called sub-mount between the light emitting element 10 and the metal member 30.

Die-Bonding Member (Not Shown)

The die-bonding member in the embodiment of the present invention is a member that secures the light emitting element 10 on the metal member 30, and is not specifically limited if it can bond them. Particularly, in terms of heat dissipation, it is preferable that the light emitting element 10 is secured on the metal member 30 with Ag paste, carbon paste, ITO paste, metal bump or the like. In particular, in the case of high power light emitting device that generates a large amount of heat, Au—Sn group eutectic solder is preferably used. The reason is that its melting point is high, thus, its structural texture is less prone to vary, and its mechanical properties are less prone to reduce. In addition, it is preferable that the bottom surface of the light emitting element 10 is partially bonded on the top surface of the metal member 30. In this case, it is possible to suppress that total internal reflection by the aforementioned die-bonding member confines light emitted from the bottom surface of the light emitting element 10 internal of the light emitting element 10. This suppression of light confinement not only can improve light outgoing efficiency of the light emitting element, but also can keep a temperature rise of the light emitting device in check.

Transparent Member 50

The transparent member 50 in the embodiment of the present invention covers the light emitting element 10 and the top surface of the insulating board 40, and serves to protect the light emitting element 10 from external force, moisture and so on from the external environment. In addition, the transparent member 50 serves to efficiently radiate light from the light emitting element 10 outward. As a specific material composing the transparent resin 50, a transparent resin with excellent weather resistance, such as epoxy resin, urea resin, silicone, denatured epoxy resin, denatured silicone resin and polyamide, or glass is suitably used. In the case where the light emitting elements 10 are arranged at high density, in order to suppress that bonding among members is damaged due to thermal shock, it is more preferable that epoxy resin, silicone resin, or combination of them is used. Additionally, in order to further increase the viewing angle, the transparent member 50 may contain a diffusion agent. Specifically, barium titanate, titanium oxide, aluminum oxide, silicon oxide, and so on, can be suitably used as the diffusion agent. Moreover, in order to cut the wavelength out of a desired range, organic or inorganic color dye, or color pigment can be contained. Furthermore, a phosphor material that absorbs at least a part of light from the light emitting element 10 and converts its wavelength can be also contained.

In the case where a phosphor material is contained in the transparent member 50, it is preferable that the transparent 50 is composed of a silicone resin or a denatured silicone resin that is less prone to be tint and deteriorate due to exposure to high energy light with short wavelength containing ultraviolet rays. In this case, it is possible to suppress color difference and color unevenness. A phosphor material that can be used in this embodiment is a material that converts light from the light emitting element. A phosphor material that converts light from the light emitting element from its original wavelength to a longer wavelength has higher efficiency. In the case where light from the light emitting element is high energy visible light with short wavelength, a YAG:Ce phosphor as one type of yttrium aluminum oxide group phosphor, or $Ca_2Si_5N_8$ is suitably used. Particularly, since a YAG:Ce phosphor absorbs a part of blue range light emitted from an LED chip and emits luminescent radiation of a yellow range as complementary color to the blue range, it is possible to relatively easily construct a high power light emitting diode that emits white range mixture light depending on the content of YAG:Ce phosphor.

Other Member

The light emitting device according to the embodiment of the present invention can be also provided with a Zener diode as protection element. The Zener diode can be disposed on the surface of the conductive member 60 similarly to the light emitting element 10, or can be constructed so that the light emitting element 10 is disposed on the top surface of the Zener diode that is disposed on the surface of the conductive member 60. On the other hand, a recessed portion can be additionally formed on the top side of the insulating board to provide space that accommodates and mounts the Zener diode.

Wire Line

Wire lines 70 electrically connect the light emitting element 10 to the conductive members 60. The wire lines 70 are required to provide good ohmic contact and mechanical connection with the electrode of the light emitting element 10 and high electrical conductivity and thermal conductivity. The thermal conductivity is preferably 0.01 cal/(S)(cm$^2$)(° C./cm) or more, and more preferably 0.5 cal/(S)(cm$^2$)(° C./cm) or more.

EXAMPLES

The following description will describe examples according to the present invention in relation to a production method according to the present invention. Note that the present invention is not limited to these examples described below.

Example 1

The light emitting device shown in FIGS. 1 through 4 as an example 1 is produced.

First Process

A plurality of holes are first formed on a base material. In this embodiment, a ceramic board is employed as an insulating board. Two green sheets that have a length of 6.0 mm, a width of 8.0 mm and a thickness of 400 μm, and contain alumina as a main material are employed as the base material. A first green sheet is provided with several hundreds of substantially rectangular first through holes. The first through holes have a substantially 2.1 mm square shape with rounded corners, and are formed by stamping. A second green sheet is provided with the same number as the first through holes of substantially rectangular second through holes. The second through holes have a substantially 1.3 mm square shape with rounded corners in the plan view, and are formed by stamping so as to overlap the first through holes.

Second Process

Subsequently, the conductive members are formed continuously from the top surface to the bottom surface of the base material. In this example, wire lines for external electrical conduction are formed in a pattern on the bottom surface of the first green sheet and the top surface of the second green sheet by using tungsten paste in a printing manner. In addition, in order to increase bonding strength between the second green sheet and the metal member 30, a conductive member is formed on a part that forms the middle surface 41 on the bottom surface side of the second green sheets. In the thus-formed laminated body composed of the first green sheet and the second green sheet laminated thereon, the first and second through holes overlap each other. Accordingly, the laminated body has a plurality of through holes that has a substantially stepped rectangle in a cross-sectional view taken along a line perpendicular to their plane surfaces. Additionally, in this example, in order to provide two grooves each side of a pair of side surfaces of the each light emitting device, the laminated body is provided with rectangular third through holes. The third through holes have has a substantially 0.5 mm×0.3 mm rectangular shape with rounded corners.

Third Process

Subsequently, metal members are inserted into the plurality of through holes so that their bottom surfaces are exposed downward of the through holes. In this example, copper bodies that have a shape corresponding to but one size smaller than the shape of the aforementioned through hole are used as the metal members. In addition, it is preferable that a tungsten film is previously formed on an inner wall of the through hole that will be in contact with a middle surface of the copper body in the foregoing second process. This can improve bonding strength between the insulating board 40 and the metal member 30. Additionally, silver solder is previously formed on the middle surface of the copper body. After bonding, silver is plated on the surfaces of the tungsten film, the copper body and the silver solder. This can suppress corrosion of metal materials of them. The thus-processed green sheets are burned at predetermined temperature to provide the insulating board. In this case, they are burned at a temperature not lower than 800 degrees for several hours. They are preferably burned not in a single stage but in multiple stages where temperatures are sequentially raised. In this case, it is possible to suppress contraction of the insulating board.

Fourth Process

Subsequently, the light emitting elements 10 are mounted onto the top surfaces of the metal members 30, and the light emitting elements are electrically connected to the conductive members.

The light emitting elements 10 are composed of a nitride semiconductor that emits blue range light. Rectangular parallelepipedonal dice that have a substantially 600 μm square shape in the plan view are used as the light emitting elements 10. Each die has two pairs of positive and negative electrodes on the top surface thereof. A eutectic material composed of Au—An is partially applied on the bottom surface of the die. The thus-processed light emitting elements 10 are bonded on plated silver of the metal body 30, then, the electrodes of each light emitting element 10 are electrically connected to the conductive members 60 formed on the top surface of the insulating board 40 by wire lines 70.

Fifth Process

Subsequently, transparent members are formed for each of the metal members. In this example, the transparent members are formed by compression molding by using a hard silicone resin as the material of transparent member. The transparent members have a substantially box shape with rounded corner. The top surfaces of the transparent members have an area smaller than the bottom surfaces. Their molding method is not limited to this. A potting method, a die cut method and so on can be given as other methods. In addition, the top surface of the metal member 30 and the exterior surface of the transparent member 50 (on the side where the sealing member is filled) form an angle of about 45 degrees. The half-value angle of light emitted from the light emitting device is about 120 degrees.

Note that the transparent member 50 may be formed entirely on the surface of the base material. However, in this case, when the board is separated an individual light emitting device in a later process, the transparent member should be also cut. This type of light emitting device that has the thus-cut transparent member is not preferable. The reason is that the transparent member may peel off due to moisture permeation from its side surface, or the transparent properties of the transparent member on its side portion may deteriorated.

Sixth Process

Finally, the aforementioned base material that is processed in the foregoing first through fifth processes is cut into an individual light emitting device, thus, the light emitting devices according to the example 1 that have a 3 mm square shape in the plan view.

Example 2

Figure 5:
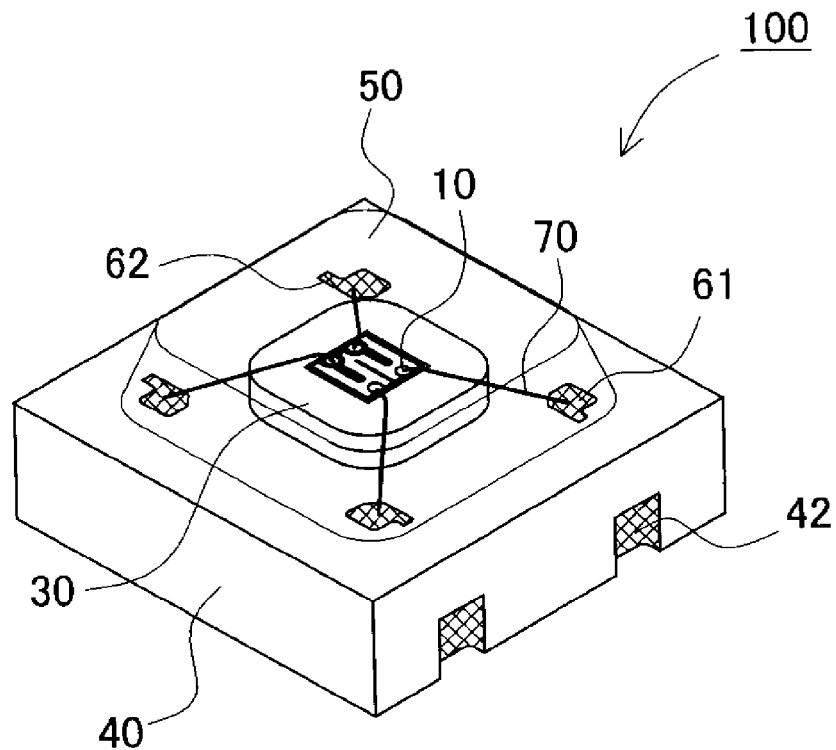
FIG. 5 is a perspective view schematically showing a light emitting device according to another embodiment of the present invention as viewed from the top surface side.

A light emitting device is produced similarly to the example 1 except that conductive members are continuously formed on the top surface of the insulating board, interior portions of the insulating board that extend in the thickness direction, and grooves on the bottom surface of the insulating board. Thus, the light emitting device as shown in FIG. 5 is provided.

Example 3

Figure 6:
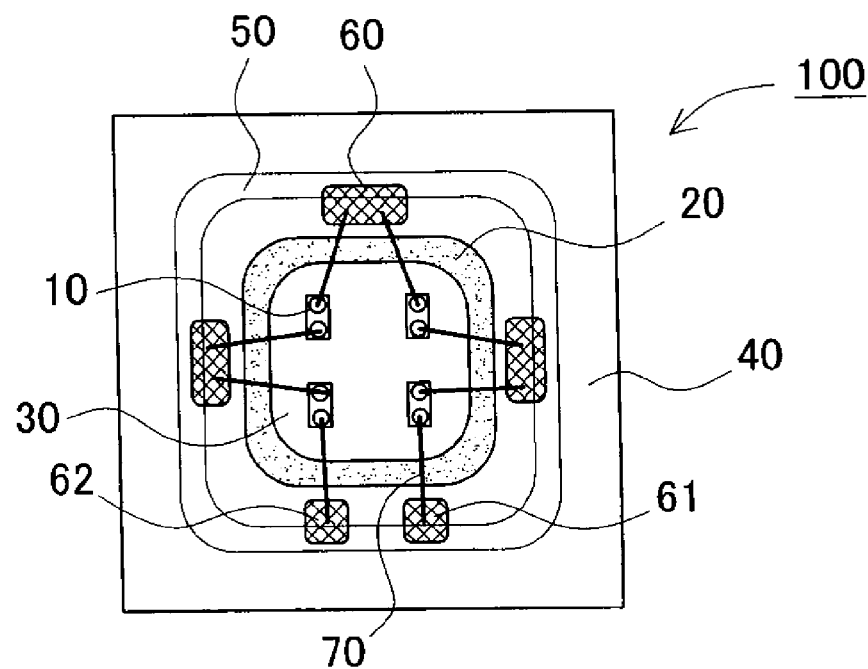
FIG. 6 is a plan view schematically showing a light emitting device according to another embodiment of the present invention as viewed from the top surface side.

A light emitting device is produced similarly to the example 2 except that four light emitting elements 10 are mounted on the top surface of the metal member 30 and are connected in serial. Thus, the light emitting device as shown in FIG. 6 is provided.

Example 4

Figure 7:
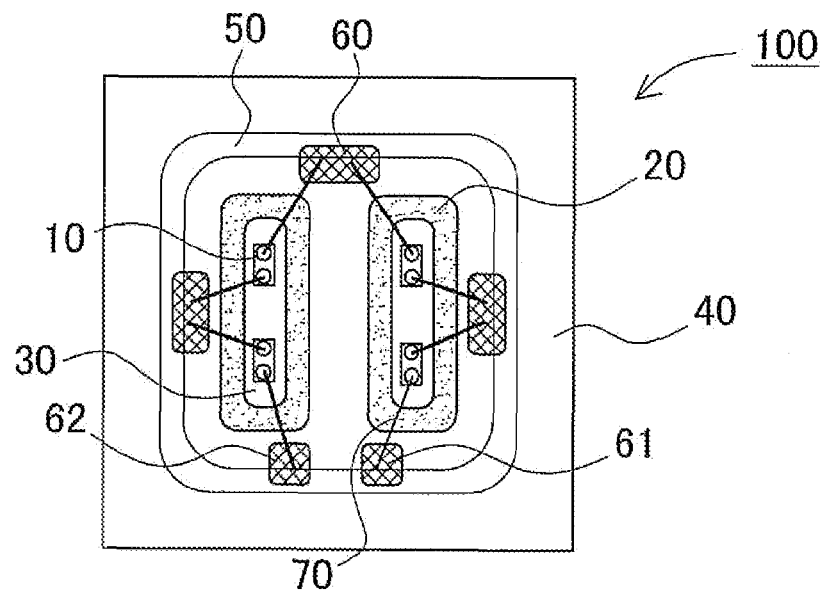
FIG. 7 is a plan view schematically showing a light emitting device according to another embodiment of the present invention as viewed from the top surface side.

A light emitting device is produced similarly to the example 2 except that two metal members 30 with a substantially rectangular shape in the plan view, each of which is provided with two light emitting elements 10 mounted on the top surface thereof, is provided, and total four light emitting elements 10 are connected in serial. Thus, the light emitting device as shown in FIG. 7 is provided.

Example 5

Figure 8:
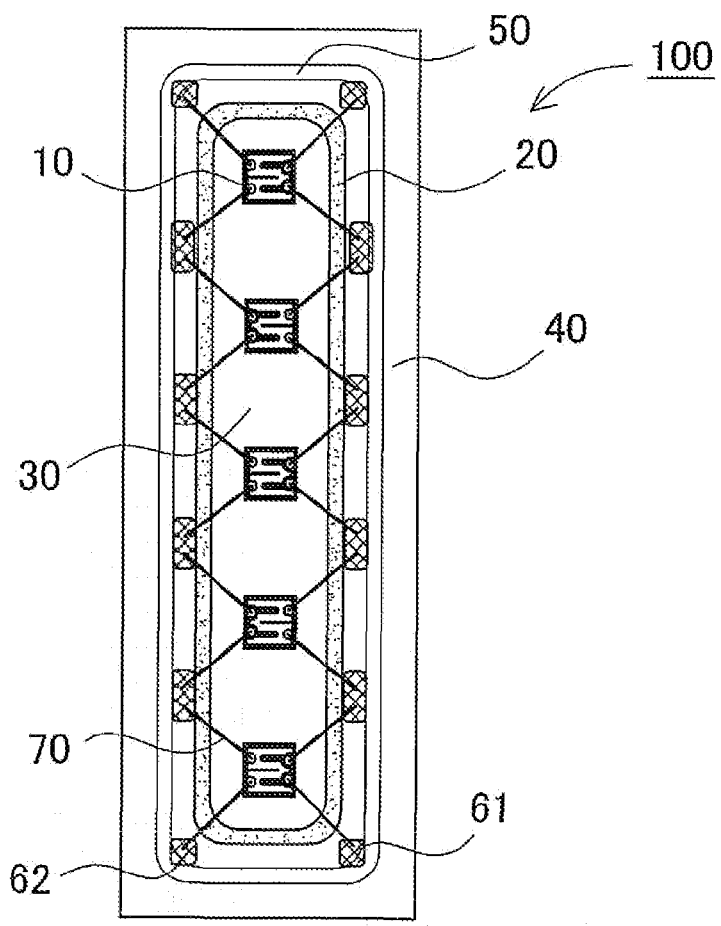
FIG. 8 is a plan view schematically showing a light emitting device according to another embodiment of the present invention as viewed from the top surface side.

A light emitting device is produced similarly to the example 2 except that one metal member 30 with a substantially rectangular shape in the plan view is provided with four light emitting elements 10 that are arranged in line and connected in serial. Thus, the light emitting device as shown in FIG. 8 is provided.

Example 6

A light emitting device is produced similarly to the example 1 except that the transparent member is formed by using an agitated mixture of a silicone resin and a phosphor material $(Y_{0.8}Gd_{0.2})_3Al_5O_{12}:Ce_{0.03}$ at a weight ratio of 100:15. Thus, the light emitting device capable of emitting white light is provided.

Example 7

Figure 9:
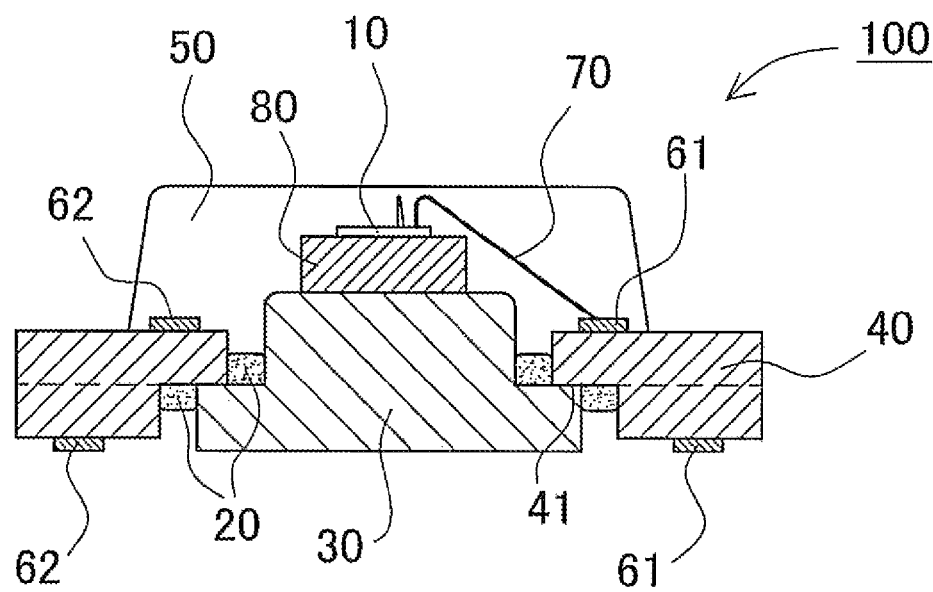
FIG. 9 is a cross sectional view schematically showing a light emitting device according to another embodiment of the present invention as viewed from the top surface side.

A light emitting device is constructed similarly to the example 1 except that a sub-mount member composed of CuW is disposed between the metal member 30 and the light emitting element 10 as shown in FIG. 9. Thus, the light emitting device that can keep high reliability in check even in harder thermal cycle is provided. In the embodiment of the present invention, the sub-mount member has a thermal conductivity greater than the mount surface of the light emitting element 10 and smaller than the metal member 30. The sub-mount member can formed of a material selected from ceramic, metal and resin material that are conventionally employed as materials for sub-mount member, such as CuW, CuMo, AlN, SiN, and alumina.

In addition, it is preferable that the metal member 30 and the sub-mount member are secured by a member that can relieve the thermal expansion coefficient [ppm/K] difference and the thermal conductivity difference. A solder material such as silver solder, a eutectic material, a resin material, and so on can be selected as the member.

Example 8

Figure 10:
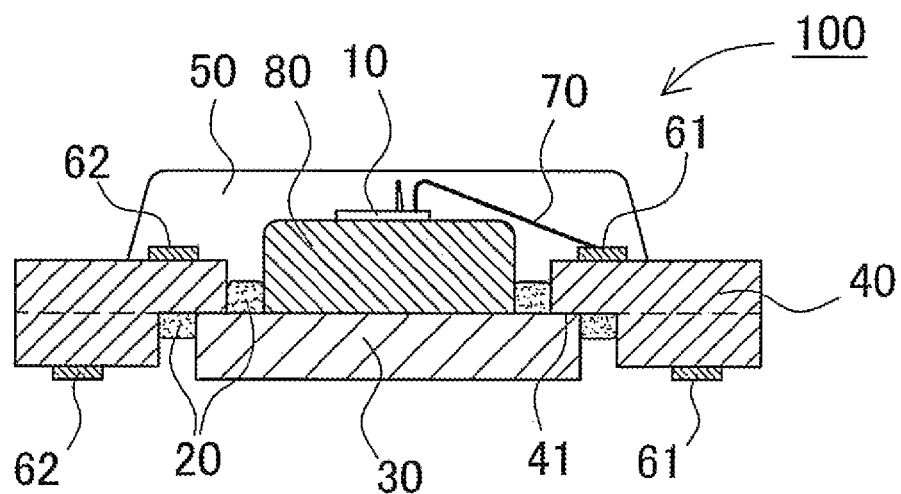
FIG. 10 is a cross sectional view schematically showing a light emitting device according to another embodiment of the present invention as viewed from the top surface side.

A light emitting device is constructed similarly to the example 1 except that a laminated body composed of the aforementioned metal member 30 and the aforementioned sub-mount member is inserted into the insulating board 40 as shown in FIG. 10. Thus, the light emitting device that can keep high reliability in check even in harder thermal cycle is provided. Specifically, a sub-mount member that has a shape similar to and one size smaller than the through hole of the aforementioned second green sheet is laminated on the top surface of the metal member 30 that has a shape similar to and one size smaller than the through hole of the aforementioned first green sheet.

Example 9

Figure 11:
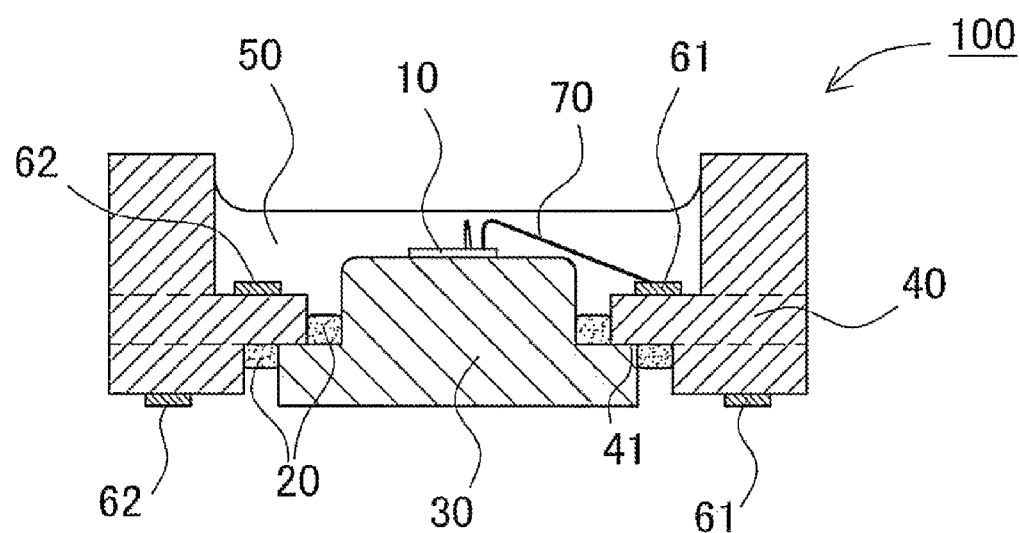
FIG. 11 is a cross sectional view schematically showing a light emitting device according to another embodiment of the present invention as viewed from the top surface side.
Figure 12:
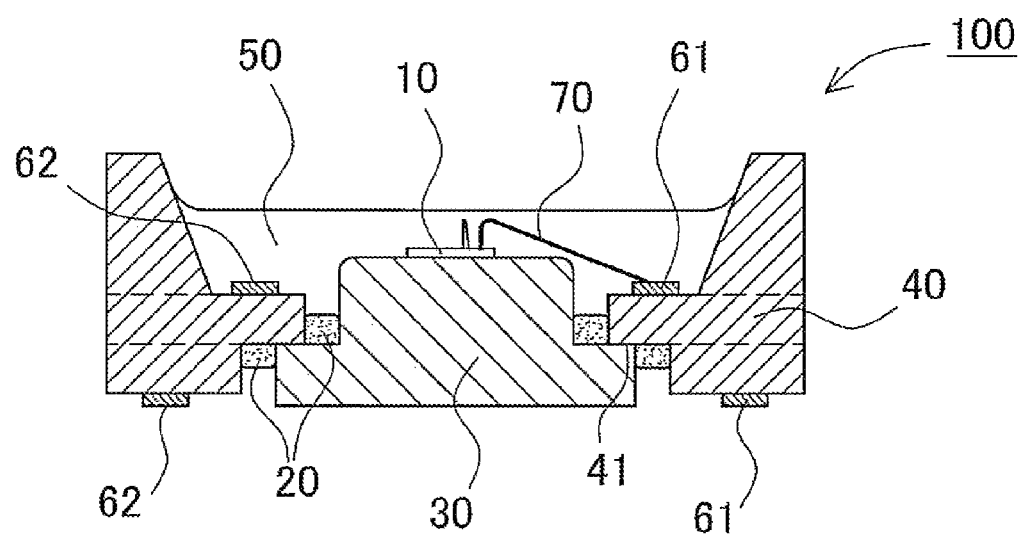
FIG. 12 is a cross sectional view schematically showing a light emitting device according to still another embodiment of the present invention as viewed from the top surface side.

A light emitting device is constructed similarly to the example 1 except that a package that has a reflective wall is used as the insulating board 40, and a transparent member is filled to reach to a height of three quarters of the reflective wall of the package as shown in FIG. 11. The reflective wall is disposed in the periphery of the light emitting element 10 and can reflect light from the light emitting element frontward. The transparent member seals the light emitting element 10. Specifically, the package can be provided by burning a third green sheet that has rectangular third through holes and is laminated on the top surface of a laminated body of first and second green sheets. The third green sheet has the same number as the aforementioned first and second through holes of the third through holes that are formed by stamping. The third through hole has a substantially 2.4 mm square shape with rounded corners, and serves as the reflective wall in this example.

Since the light emitting device according to the embodiment of the present invention has the reflective wall that serves to effectively direct light from the light emitting element and is disposed in the periphery of the light emitting element, the reflective wall can control the directivity. In addition, since the conductive members are continuously formed on the top surface of the insulating board, interior portions of the insulating board that extend in the thickness direction, and grooves on the bottom surface of the insulating board in the package according to this example, the conductive members are not exposed between the reflective wall and the insulating board. Therefore, leakage may not occur.

Example 10

A light emitting device is constructed similarly to the example 9 except that the reflective wall and the top surface of the metal member 30 form an obtuse angle. Specifically, the package can be provided by forming the aforementioned through hole of the third green sheet as the side wall part so that its width becomes wider as closer to the top surface. In this example, a metal member that effectively reflects light from the light emitting element 10 can be formed on the interior surface of the side wall. In this case, an Ag layer or a rhodium layer is preferably formed.

Installation of Light Emitting Device

In the light emitting device according to the embodiment of the present invention, since the bottom surfaces of the metal member and the conductive member are substantially coplanar with each other on the bottom surface side of the insulating board, even in the case where the light emitting device is directly installed on a circuitry board, it is possible to easily bring both the bottom surfaces of the metal member and the conductive member in contact with the circuitry board. Specifically, the light emitting device according to the embodiment of the present invention is put directly onto a circuitry board that has threaded holes, and edges of the light emitting device are surrounded by a holder that has through holes for screws corresponding to the threaded holes. Thus, the light emitting device can be secured on the circuitry board by fastening screws from the threaded hole side. In addition, through holes for screws can be disposed on edge parts of the light emitting device to secure the light emitting device onto the circuitry board by fastening screws directly into the through holes of the light emitting device.

The present invention is applicable to a light emitting device used in lighting for mobile phone backlight, display capable of displaying various types of data, light source for various types of sensors such as line sensor, indicator, and so on.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims.

The present application is a continuation application of patent application Ser. No. 11/615,593, which is based on Japanese Patent Application No. 2006-006489 filed in Japan on Jan. 13, 2006, and Japanese Patent Application No. 2006-

079147 filed in Japan on Mar. 22, 2006. The contents of these patent applications are incorporated herein by reference.

What is claimed is:

1. A light emitting device comprising:
an insulating board that defines a through hole;
a metal member that is inserted into the through hole;
a light emitting element that is mounted on the top surface of the metal member;
a conductive member that is formed on the insulating board and is electrically connected to the light emitting element; and
a transparent member that covers the light emitting element and the top surface of the insulating board,
wherein the metal member has a substantially stepped rectangle in a cross-sectional view,
wherein the top surface of the substantially stepped rectangle of the metal member projects higher than the top surface of the insulating board, and
wherein the insulating board is mated with the metal member.

2. The light emitting device according to claim 1, wherein the half-value angle of light that outgoes from the light emitting element through the transparent member is greater than 90 degrees.

3. The light emitting device according to claim 1, wherein the top surface of the metal member projects higher than the top surface of the insulating board, and the top surface of the metal member and the exterior surface of the sealing member form an angle not more than 90 degrees.

4. The light emitting device according to claim 1, wherein the through hole of the insulating board has an inner wall that is formed in a substantially stepped rectangle corresponding to the substantially stepped rectangle of the metal member.

5. The light emitting device according to claim 1, wherein the sides of the metal member is partially mated with the inner wall of the through hole defined in the insulating board.

6. The light emitting device according to claim 5, wherein the sides of the metal member is partially bonded with the inner wall of the through hole defined in the insulating board via an adhesive member that contains a principal component of the metal member.

7. The light emitting device according to claim 5, wherein a metal film is formed on the surfaces of the metal member, the metal film contiguously extending to the adhesive member.

8. The light emitting device according to claim 1, wherein the conductive member is continuously formed from the top surface to the bottom surface of the insulating board, and the bottom surface of the metal member is substantially coplanar with the bottom surface of the conductive member on the bottom surface side of the insulating board.

9. The light emitting device according to claim 1, wherein an opening width of the through hole opening on the lower surface of the insulating board is wider than that on the upper surface of the insulating board.

10. The light emitting device according to claim 1, wherein an opening width of the through hole opening on the upper surface of the insulating board is formed to be wider as closer to the top side, and an opening width of the through hole opening on the lower surface of the insulating board is formed to be wider as closer to the bottom side.

11. The light emitting device according to claim 1, wherein the insulating board is made of ceramic material.

12. The light emitting device according to claim 1, wherein the insulating board has a reflective wall thereon.

* * * * *